US012658923B2

(12) United States Patent
Ben Hamida et al.

(10) Patent No.: US 12,658,923 B2
(45) Date of Patent: Jun. 16, 2026

(54) N:1 MUX DRIVER FOR ULTRA-HIGH SPEED TRANSMITTER

(71) Applicant: CIENA CORPORATION, Hanover, MD (US)

(72) Inventors: Naim Ben Hamida, Ottawa (CA); Faisal Ahmed Musa, Stittsville (CA); Ahmed Mustafa, Kanata (CA); Mouna Safi-Harab, Montreal (CA)

(73) Assignee: CIENA CORPORATION, Hanover, MD (US)

( * ) Notice: Subject to any disclaimer, the term of this patent is extended or adjusted under 35 U.S.C. 154(b) by 520 days.

(21) Appl. No.: 18/310,842

(22) Filed: May 2, 2023

(65) Prior Publication Data

US 2024/0372552 A1 Nov. 7, 2024

(51) Int. Cl.
*H03K 19/20* (2006.01)
*H03K 17/00* (2006.01)

(52) U.S. Cl.
CPC ........... *H03K 19/20* (2013.01); *H03K 17/002* (2013.01)

(58) Field of Classification Search
None
See application file for complete search history.

(56) References Cited

U.S. PATENT DOCUMENTS 4,614,882 A * 9/1986 Parker ................. G06F 13/4072
326/34

8,203,900 B2 * 6/2012 Lee ...................... G11C 11/4093
365/219
2011/0007591 A1 * 1/2011 Lee ...................... G11C 7/1057
365/219
2025/0149089 A1 * 5/2025 Chiang .................. G11C 15/04

FOREIGN PATENT DOCUMENTS

EP 0123335 A1 10/1984
KR 101888786 B1 8/2018

OTHER PUBLICATIONS

International Search Report & Written Opinion for PCT/US2024/026423 mailed Aug. 20, 2024, 16 pp.
Kim, Jihwan , et al., "A 224-Gb/s DAC-Based PAM-4 Quarter-Rate Transmitter With 8-Tap FFE in 10-nm FinFET", IEEE Journal of Solid-State Circuits, vol. 57, No. 1, Jan. 2022, pp. 6-20.
Kossel, Marcel A., et al., "8.3 An 8b DAC-Based SST TX Using Metal Gate Resistors with 1.4pJ/b Efficiency at 112Gb/s PAM-4 and 8-Tap FFE in 7nm CMOS", ISSCC 2021 / Session 8 / Ultra-High-Speed Wireline / 8.3, IEEE International Solid-State Circuits Conference, Feb. 2021, 3 pp.

(Continued)

*Primary Examiner* — Jany Richardson
(74) *Attorney, Agent, or Firm* — Guntin & Gust, PLC; Dana B. LeMoine

(57) ABSTRACT

Aspects of the subject disclosure may include, for example, N-to-1 multiplexers and pulse generators that include NOR logic. The NOR logic pulse generators may include parallel transistors responsive to data and clock signals to pull down an output node when any of the data or clock signals are asserted. The NOR logic pulse generator may also include a pullup structure that includes no more than one active device channel in series between a supply node and the output node. Other embodiments are disclosed.

20 Claims, 5 Drawing Sheets

(56) References Cited

OTHER PUBLICATIONS

Wang, Zhongkai , et al., "An Output Bandwidth Optimized 200-Gb/s PAM-4 100-Gb/s NRZ Transmitter With 5-Tap FFE in 28-nm CMOS", IEEE Journal of Solid-State Circuits, vol. 57, No. 1, Jan. 2022, pp. 21-31.

Ye, Bingyi , et al., "A 2.29-pJ/b 112-Gb/s Wireline Transceiver With RX Four-Tap FFE for Medium-Reach Applications in 28-nm CMOS", IEEE Journal of Solid-State Circuits, vol. 58, No. 1, Jan. 2023, pp. 19-29.

International Preliminary Report on Patentability for PCT/US2024/026423 mailed Nov. 13, 2025, 9 PGs.

* cited by examiner

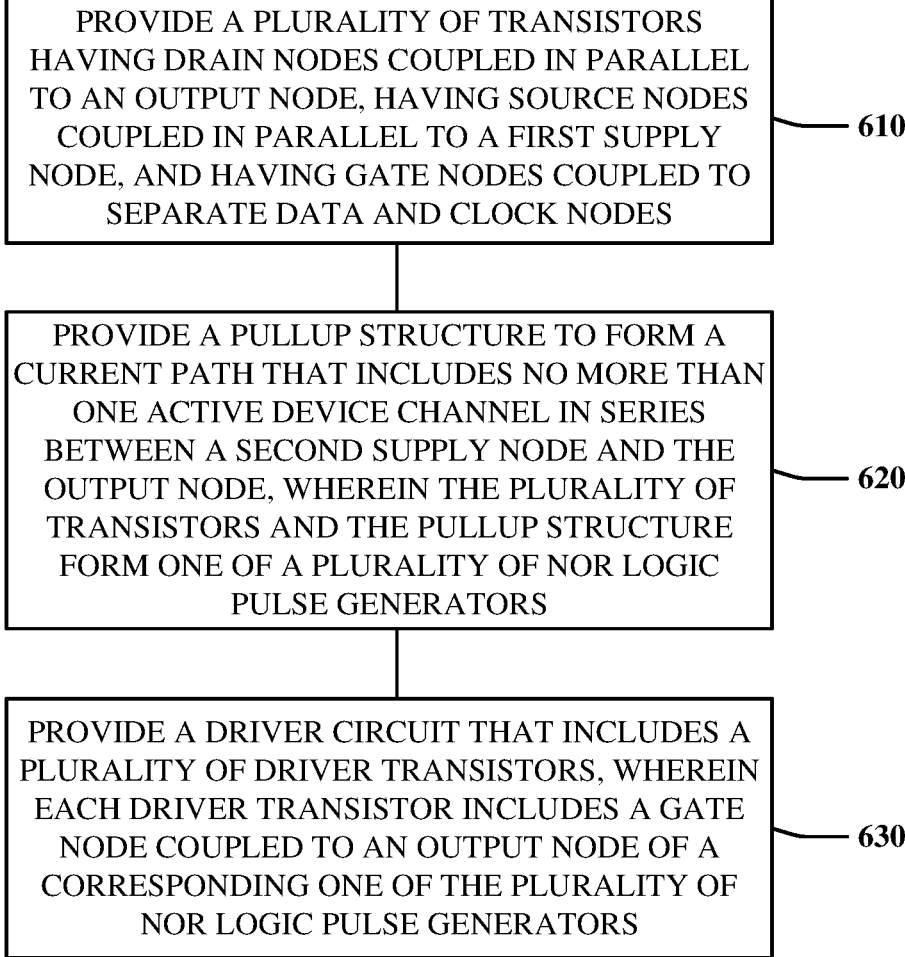

PROVIDE A PLURALITY OF TRANSISTORS HAVING DRAIN NODES COUPLED IN PARALLEL TO AN OUTPUT NODE, HAVING SOURCE NODES COUPLED IN PARALLEL TO A FIRST SUPPLY NODE, AND HAVING GATE NODES COUPLED TO SEPARATE DATA AND CLOCK NODES — 610

PROVIDE A PULLUP STRUCTURE TO FORM A CURRENT PATH THAT INCLUDES NO MORE THAN ONE ACTIVE DEVICE CHANNEL IN SERIES BETWEEN A SECOND SUPPLY NODE AND THE OUTPUT NODE, WHEREIN THE PLURALITY OF TRANSISTORS AND THE PULLUP STRUCTURE FORM ONE OF A PLURALITY OF NOR LOGIC PULSE GENERATORS — 620

PROVIDE A DRIVER CIRCUIT THAT INCLUDES A PLURALITY OF DRIVER TRANSISTORS, WHEREIN EACH DRIVER TRANSISTOR INCLUDES A GATE NODE COUPLED TO AN OUTPUT NODE OF A CORRESPONDING ONE OF THE PLURALITY OF NOR LOGIC PULSE GENERATORS — 630

N:1 MUX DRIVER FOR ULTRA-HIGH SPEED TRANSMITTER

FIELD OF THE DISCLOSURE

The subject disclosure relates to pulse generators and N-to-1 multiplexers.

BACKGROUND

Typical N-to-1 multiplexers may use "stacked devices" within pulse generators to generate pulses internal to the multiplexer. For example, an AND logic architecture may include multiple active device channels in series (e.g., multiple transistors coupled drain-to-source) to logically combine data signals and clock signals of various phases.

BRIEF DESCRIPTION OF THE DRAWINGS

Reference will now be made to the accompanying drawings, which are not necessarily drawn to scale, and wherein:

FIG. 6 shows an illustrative embodiment of a method in accordance with various aspects described herein.

DETAILED DESCRIPTION

Figure 1:
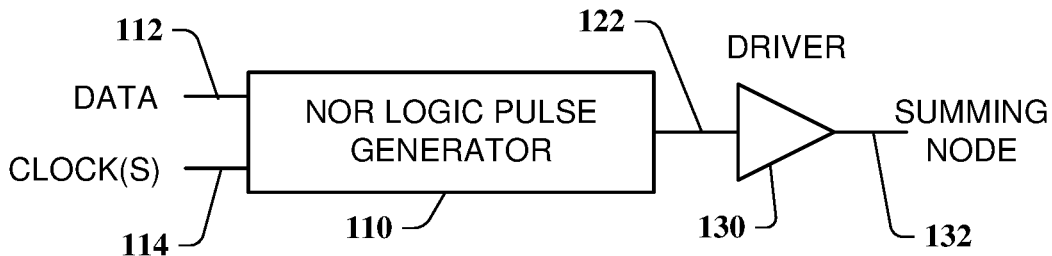
FIGS. 1 and 2 are block diagrams illustrating example, non-limiting embodiments of NOR logic pulse generators with driver devices in accordance with various aspects described herein.

One or more aspects of the subject disclosure include a device having a first NOR logic pulse generator. The first NOR logic pulse generator may include a plurality of transistors having drain nodes coupled in parallel to an output node, having source nodes coupled in parallel to a first supply node, and having gate nodes coupled to separate data and clock nodes. The first NOR logic pulse generator may also include a pullup structure coupled between the output node and a second supply node, wherein the pullup structure is configured to pull up the output node when the plurality of transistors are off.

Additional aspects include the plurality of transistors being configured to pull down the output node when any signal on any of the data and clock nodes is asserted; and a driver transistor having a gate node coupled to the output node of the first NOR logic pulse generator, wherein the driver transistor is a sole active device that presents a capacitive load to the output node.

Additional aspects also include the driver transistor having a drain node coupled drain nodes of other driver transistors that are in turn driven by other NOR logic pulse generators.

Additional aspects also include a plurality of NOR logic pulse generators, wherein the first NOR logic pulse generator is one of the plurality of NOR logic pulse generators; wherein each of the plurality of NOR logic pulse generators is driven by different data signals and different combinations of clock signals; and a plurality of driver transistors, wherein each of the plurality of driver transistors includes a gate node driven by a corresponding one of the plurality of NOR logic pulse generators, wherein the plurality of driver transistors include source nodes coupled in parallel and drain nodes coupled in parallel.

Additional aspects include the pullup structure having a single transistor forming a series current path between the output node and the second supply node that includes no more than one active device channel, or the pullup structure having an active inductor device including no more than one active device channel forming a current path between the second supply node and the output node.

One or more aspects of the subject disclosure include an N-to-1 multiplexer device, having a plurality of NOR logic pulse generators, wherein each of the plurality of NOR logic pulse generators may include a plurality of transistors having drain nodes coupled in parallel to an output node, having source nodes coupled in parallel to a first supply node, and having gate nodes coupled to separate data and clock nodes; and a pullup structure including at least one transistor coupled to form a current path that includes no more than one active device channel in series between a second supply node and the output node. The N-to-1 multiplexer device may also include a driver circuit that includes a plurality of driver transistors, wherein each of the driver transistors includes a gate node coupled to the output node of a corresponding one of the plurality of NOR logic pulse generators, and wherein the plurality of driver transistors include drain nodes coupled in parallel to sum output signals from the plurality of NOR logic pulse generators.

Additional aspects include the N-to-1 multiplexer device including N NOR logic pulse generators or 2N NOR logic pulse generators to produce differential outputs. A number of clock signals fed to each of the plurality of NOR logic pulse generators may be equal to log 2N, and the pullup structure may be an active inductor device. Further additional aspects include each of the plurality of NOR logic pulse generators being driven by different data signals and different combinations of clock signals.

One or more aspects of the subject disclosure include a method. The method can comprise providing a plurality of transistors having drain nodes coupled in parallel to an output node, having source nodes coupled in parallel to a first supply node, and having gate nodes coupled to separate data and clock nodes; and providing a pullup structure including at least one transistor coupled to form a current path that includes no more than one active device channel in series between a second supply node and the output node, wherein the plurality of transistors and the pullup structure form a NOR logic pulse generator that pulls down the output node when any of the plurality of transistors are on and pulls up the output node when all of the plurality of transistors are off. The method can further comprise repeating the providing the plurality of transistors and the providing the pullup structure to form a plurality of NOR logic pulse generators, and providing a driver circuit that includes a plurality of driver transistors, wherein each of the driver transistors includes a gate node coupled to the output node of a corresponding one of the plurality of NOR logic pulse generators, and wherein the plurality of driver transistors include drain nodes coupled in parallel to sum output signals from the plurality of NOR logic pulse generators.

Various embodiments include an N-to-1 Multiplexer driver architecture for high speed communication systems. The described architecture is hardware efficient, exhibits superior performance, and provides lower clock path load-
ing compared to conventional multiplexer architectures.
Various embodiments do not combine input data and clocks
in the multiplexer using stacked transistor-based AND logic
as is commonly done in conventional architectures. Stacked
architectures utilize higher supply voltages and rail-to-rail
clocks, both of which lead to higher power consumption. In
various embodiments described herein, the input data and
clock signals are combined in parallel transistors forming a
pull-down NOR logic as a Pulse Generator (PG). In some
embodiments, the pullup portion of the NOR logic is
replaced with an active load to improve the bandwidth and
eliminate transistor stacking. Further, in some embodiments,
instead of combining the N PGs of the multiplexer prior to
the driver and slowing down the multiplexer output with
"dead loads" caused by the capacitive loading of the addi-
tional PG output nodes, various embodiments described
herein combine each PG of the N-to-1 multiplexer at the
output of the driver and removes what would otherwise be
presented to the PG output as additional capacitive loading
(dead load). Various embodiments of the multiplexer topol-
ogy described herein produces Return to Zero (RZ) pulses at
the gate of the driver which makes it more robust with
respect to Inter Symbol Interference (ISI) compared to NRZ
(Non Return to Zero) pulses produced in conventional
architectures.

FIG. 1 shows a block diagram illustrating example, non-
limiting embodiments of NOR logic pulse generators with
driver devices in accordance with various aspects described
herein. Nor logic pulse generator 110 receives a data signal
on node 112 and clock signals on node(s) 114. NOR logic
pulse generator 110 drives output node 122 which is then
input to driver device 130. Driver device 130 then drives
summing node 132.

In operation, NOR logic pulse generator 110 produces a
negative pulse on output node 122 when any of data signals
on node 112 or clock signals on node 114 are asserted. This
is in contrast to pulse generators that use different types of
logic, such as NAND logic or AND logic, in which the
output signal is asserted only when multiple input signals are
simultaneously asserted.

Pulses produced by NOR logic pulse generator 110 on
output node 122 are input to driver device 130. In some
embodiments, NOR logic pulse generator 110 drives a single
active device (e.g., a transistor gate node) within driver
device 130. Because NOR logic pulse generator 110 drives
a single driver device 130, and does not drive multiple driver
devices, NOR logic pulse generator 110 may operate at a
high rate of speed as compared to pulse generators that drive
higher capacitive loads.

Figure 2:
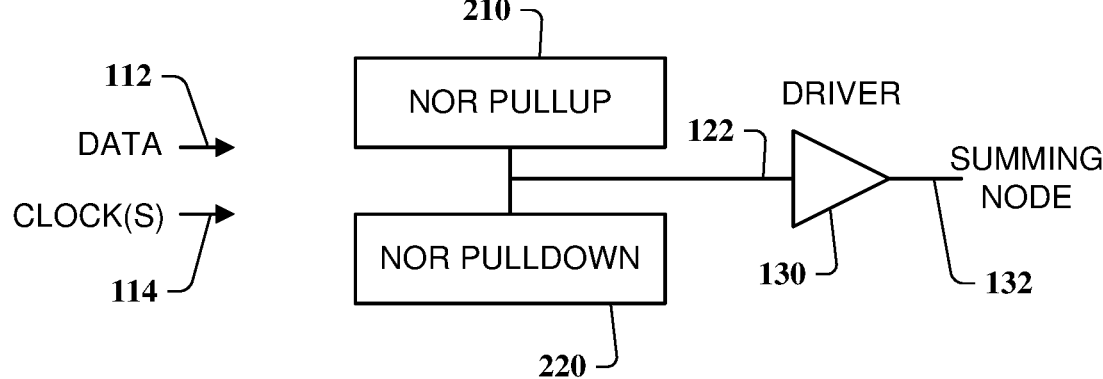

FIG. 2 shows a block diagram illustrating example, non-
limiting embodiments of NOR logic pulse generators with
driver devices in accordance with various aspects described
herein. The NOR logic pulse generator shown in FIG. 2
includes NOR pullup structure 210 and NOR pulldown
structure 220. In some embodiments, both NOR pullup
structure 210 and NOR pulldown structure 220 are respon-
sive to data signals on node 112 and clock signals on node
114. For example, NOR pullup structure 210 may pull
output node 122 up to a supply node voltage when a
particular combination of data and clock values are pre-
sented on nodes 112, 114. Also for example, NOR pulldown
structure 220 may pull down output node 122 to a different
supply node voltage when any of the data signals on node
112 or clock signals on node 114 are asserted. Also in some
embodiments, NOR pullup structure 210 is not responsive to
signal values on nodes 112 and 114. For example, NOR pullup structure 210 may include a circuit that pulls output
node 122 up to a supply node voltage whenever NOR
pulldown structure 220 is not pulling output node 122 down
to the different supply node voltage. Various embodiments
of NOR pullup structure 210 and NOR pulldown structure
220 are described further below.

Figure 3:
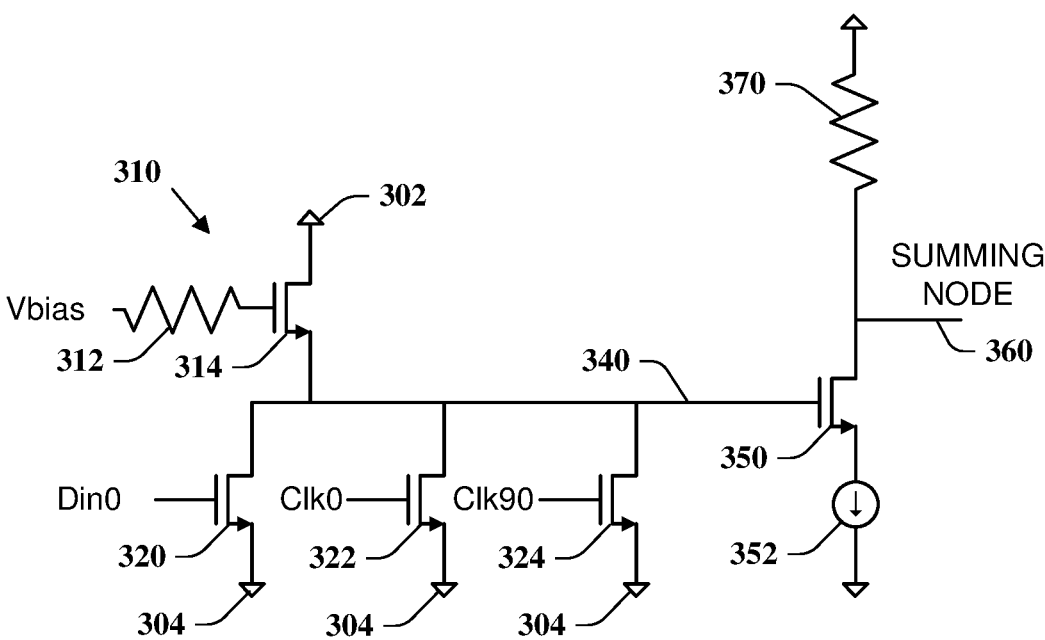
FIG. 3 shows a diagram illustrating example, non-limiting embodiments of NOR logic pulse generator circuit with a driver device in accordance with various aspects described herein.

FIG. 3 shows a diagram illustrating example, non-limiting
embodiments of a NOR logic pulse generator circuit with a
driver device in accordance with various aspects described
herein. FIG. 3 includes transistors 314, 320, 322, 324, and
350. Transistors 320, 322, and 324 form a NOR pulldown
structure, such as NOR pulldown structure 220 (FIG. 2).
Transistors 320, 322, and 324 have drain nodes coupled in
parallel to output node 340, which corresponds to output
node 122 (FIG. 2). Transistors 320, 322, and 324 also have
source nodes coupled in parallel to a first supply node 304.
Transistor 320 includes a gate node driven by a data signal
shown in FIG. 3 as Din0. Transistor 322 includes a gate node
driven by a clock signal shown in FIG. 3 as Clk0. Transistor
324 includes a gate node driven by another clock signal
shown in FIG. 3 as Clk90.

Transistor 314 and resistor 312 form a NOR pullup
structure such as NOR pullup structure 210 (FIG. 2). In
embodiments represented by FIG. 3, the NOR pullup struc-
ture is not responsive to the data and clock signals, but is
instead implemented as an active inductor 310 that does not
receive data and/or clock signals as input. Transistor 314
includes a source node coupled to output node 340 and also
includes a drain node coupled to second supply node 302.
Resistor 312 is coupled between a node having a bias
voltage Vbias and a gate node of transistor 314.

In operation, the NOR logic pulse generator shown in
FIG. 3 operates to pull output node 340 down to (or close to)
a first supply node voltage on supply node 304 whenever any
of the data or clock signals are asserted. Further, when none
of the data or clock signals are asserted, active inductive
circuit 310 operates to pull output node 340 up to (or close
to) a voltage on second supply node 302.

In some embodiments, a current path between supply
node 302 and output node 340 includes only a single active
device channel. For example, the drain-to-source channel of
transistor 314 is the sole series active device channel
between supply node 302 and output node 340. Similarly, a
current path between output node 340 and first supply node
304 includes no more than one active device channel in
series. For example, a current path may be formed between
output node 340 and first supply node 304 by any of the
drain-to-source device channels of transistors 320, 322, and
324.

Transistor 350 is a single driver transistor having a gate
node coupled to output node 340, a drain node coupled to
summing node 360, and a source node coupled to current
source 352. When transistor 350 is turned on by a voltage
presented on output node 340, a voltage is provided on
summing node 360 that is a function of the current provided
by current source 352 and load device 370. As described
further below, in some embodiments, multiple NOR logic
pulse generators and driver transistors (or groups of NOR
logic pulse generators and driver transistors) may be coupled
in parallel with each having different current sources. The
current values in the various current sources provide differ-
ent bit weightings such that summing node 360 sums
voltages corresponding to the weighting of bit values in a
digital word.

As shown in FIG. 3, the NOR logic pulse generator output
node 340 drives a single active device capacitive load. For
example, output node 340 drives a single gate node of a single transistor (driver transistor 350), and does not drive multiple transistor gates or other output nodes of other pulse generators. By not driving multiple active device capacitive loads, operating bandwidth may be increased. For example, charging output node 340 through the current path between second supply node 302 and output node 340 is generally faster for lower capacitive loads presented on output node 340. Similarly discharging output node 340 through the current path between output node 340 and first supply node 302 is generally faster for lower capacitive loads presented on output node 340.

Figure 4:
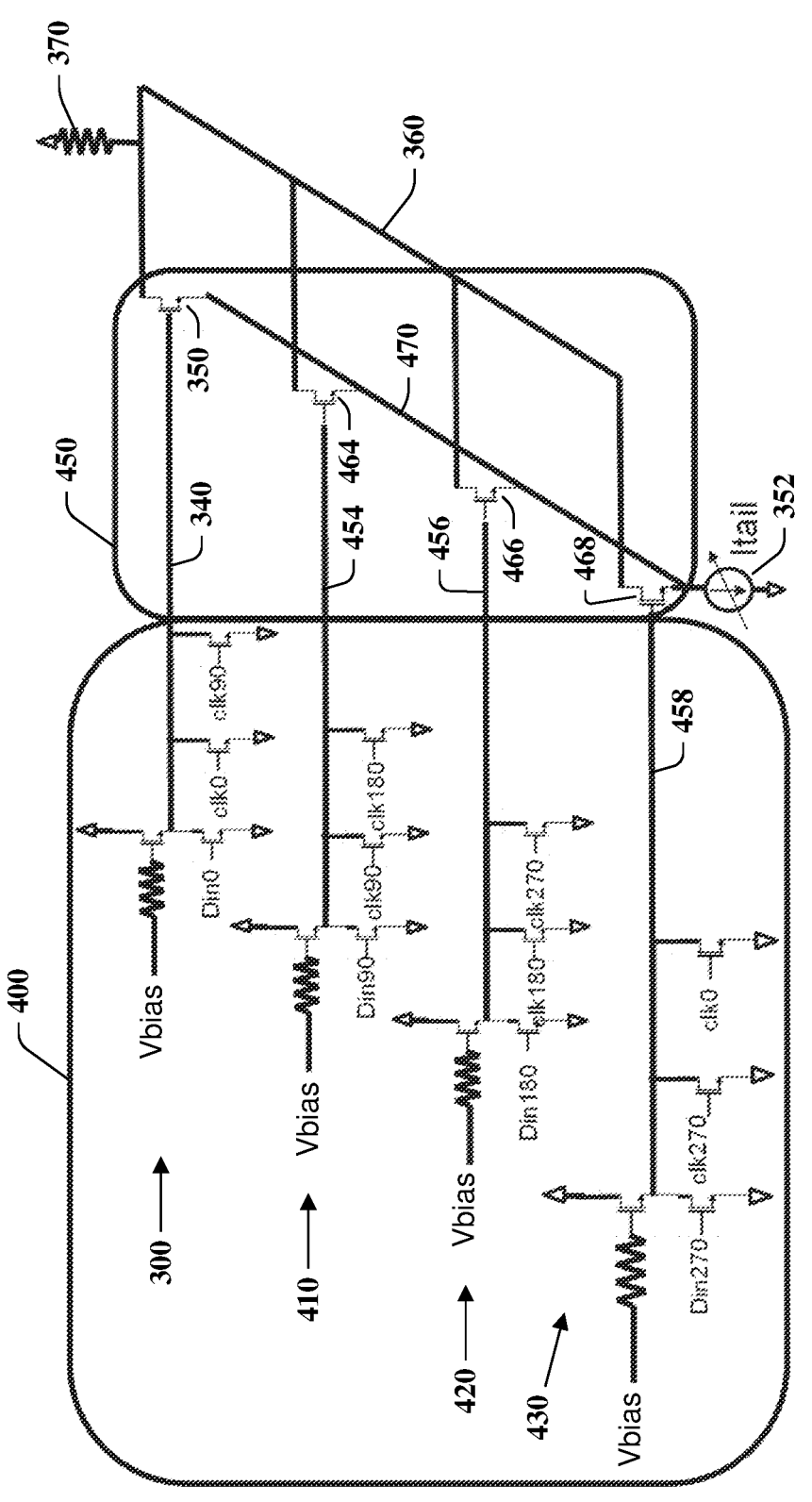
FIG. 4 shows a diagram illustrating example, non-limiting embodiments of an N-to-1 multiplexer and driver device in accordance with various aspects described herein.

FIG. 4 shows a diagram illustrating example, non-limiting embodiments of an N-to-1 multiplexer and driver device in accordance with various aspects described herein. FIG. 4 shows a plurality of NOR logic pulse generators 400 and a driver circuit 450. The plurality of pulse generators 400 includes NOR logic pulse generators 300, 410, 420, and 430. Nor logic pulse generator 300 drives output node 340 which in turn drives driver transistor 350 as described above with reference to FIG. 3. Similarly, NOR logic pulse generator 410 drives output node 454 which in turn drives the gate node of driver transistor 464. Nor logic pulse generator 420 drives output node 456 which in turn drives the gate node of driver transistor 466. Nor logic pulse generator 430 drives output node 458 which in turn drives the gate node of driver transistor 468.

The operation of NOR logic pulse generators 300, 410, 420, and 430 are similar and are described above with reference to FIG. 3. NOR logic pulse generator 300 receives data signal Din0 and clock signals Clk0 and Clk90. NOR logic pulse generator 410 receives data signal Din90 and clock signals Clk90 and Clk180. NOR logic pulse generator 420 receives data signal Din180 and clock signals Clk180 and Clk270. Nor logic generator 430 receives data signal Din270 and clock signals Clk270 and Clk0.

Driver circuit 450 includes driver transistors 350, 464, 466, and 468. Driver transistors 350, 464, 466, and 468 have drain nodes coupled in parallel at summing node 360, and have source nodes coupled in parallel to current source 352. Each of the driver transistors 350, 464, 466, and 468 present an active device capacitive load to a single and separate NOR logic pulse generator. For example, transistor 350 presents a single gate node capacitive load on output node 340, driver transistor 464 provides a single gate node capacitive load on output node 454, driver transistor 466 presents a single gate node capacitive load on output node 456, and driver transistor 468 provides a single gate node capacitive load on output node 458.

In operation, the N-to-1 multiplexer and driver device shown in FIG. 4 time multiplexes the output of each NOR logic pulse generator onto summing node 360. Each nor logic pulse generator receives a single data signal and multiple clock signals of different phases. In the example of FIG. 4, N is equal to 4 and each NOR logic pulse generator receives two clock signals of different phases. In general, the number of clock phases received by each NOR logic pulse generator is equal to $\log_2 N$ and the number of NOR logic pulse generators included at 400 is equal to N. For example, in an 8-to-1 multiplexer embodiment, eight NOR logic pulse generators may be included at 400 and each of the included NOR logic pulse generators may receive $\log_2(8)$, (which is equal to 3), separate clock signals, each having different phases.

In embodiments represented by FIG. 4, the output at summing node 360 is a single ended output. In these embodiments, the number of NOR logic pulse generators is equal to N.

In some embodiments, the data that is input to the plurality of NOR logic pulse generators 400 represents a bit in a digital word having a weight corresponding to the bit position. For example, in a 5 bit digital word, bit 0 may have a weighting of $2^0=1$, bit one may have a weighting of weighting of $2^1=2$, bit two may have a weighting of weighting of $2^2=4$, bit three may have a weighting of weighting of $2^{13}=8$, and bit four may have a weighting of weighting of $2^{14}=16$. In these embodiments, the N-to-1 multiplexer and driver circuit shown in FIG. 4 may be replicated five times where each of the N-to-1 multiplexers receives a bit of a different weight, and the corresponding current source 352 provides a current value to weight the output summed at 360 by the bit weight corresponding to the bit position of the input bit.

Figure 5:
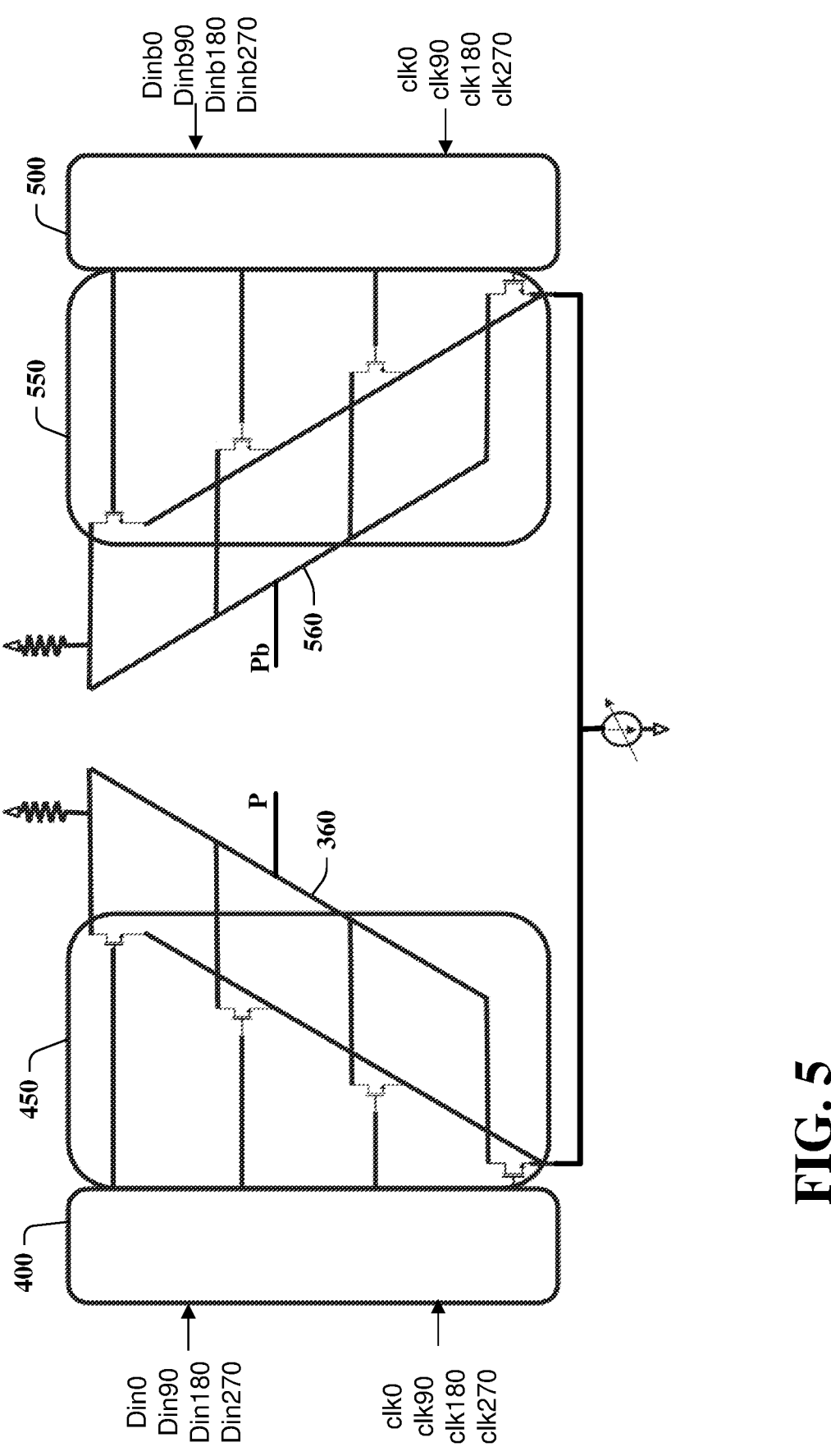
FIG. 5 shows a diagram illustrating example, non-limiting embodiments of an N-to-1 multiplexer and driver device with differential outputs in accordance with various aspects described herein.

FIG. 5 shows a diagram illustrating example, non-limiting embodiments of an N-to-1 multiplexer and driver device with differential outputs in accordance with various aspects described herein. The N-to-1 multiplexer and driver device shown in FIG. 5 provides a differential output at nodes 360 and 560. One half of the differential circuit includes the plurality of NOR logic pulse generators 400 and driver device 450 as described above with reference to FIG. 4. The second half of the differential circuit includes another instance of a plurality of NOR logic pulse generators 500 and a driver circuit 550. The operation of the plurality of NOR logic pulse generators 500 and driver device 550 are the same as the plurality of NOR logic pulse generators 400 and driver device 450, with the exception of the inverted input data provided to the plurality of neurologic pulse generators 500.

FIG. 6 depicts an illustrative embodiment of a method in accordance with various aspects described herein. At 610, a plurality of transistors are provided having drain nodes coupled in parallel to an output node, having source nodes coupled in parallel to a first supply node, and having gate nodes coupled to separate data and clock nodes. In some embodiments, this corresponds to transistors 320, 322, and 324 (FIG. 3) having drain nodes coupled to output node 340, source nodes coupled to supply node 304, and gate nodes driven as shown in FIG. 3.

At 620, a pullup structure is provided to form a current path that includes no more than one active device channel in series between a second supply node and the output node, wherein the plurality of transistors and the pullup structure form one of a plurality of NOR logic pulse generators. In some embodiments, the pullup structure of 620 corresponds to an active inductor circuit such as active inductor circuit 310 (FIG. 3). Also, the plurality of NOR logic pulse generators may correspond to the plurality of NOR logic pulse generators 400 (FIG. 4).

At 630, a driver circuit is provided that includes a plurality of driver transistors, wherein each driver transistor includes a gate node coupled to an output node of a corresponding one of the plurality NOR logic pulse generators. In some embodiments, this corresponds to driver circuit 450 including driver transistors 350, 464, 466, and 468, each including a gate node coupled to an output node of one of the plurality of NOR logic pulse generators 400 (FIG. 4).

While for purposes of simplicity of explanation, the respective processes are shown and described as a series of blocks in FIG. 6, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Note, one or more blocks can be performed in response to one or more other blocks.

Further, some portions of embodiments can be combined with portions of other embodiments.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage, "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SL-DRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:
1. A device comprising:
a first NOR logic pulse generator that includes:
   a plurality of transistors having drain nodes coupled in parallel to an output node, having source nodes coupled in parallel to a first supply node, and having gate nodes coupled to separate data and clock nodes; and a pullup structure coupled between the output node and a second supply node, wherein the pullup structure is configured to pull up the output node when all of the plurality of transistors are off, and wherein the pullup structure comprises an active inductor device.

2. The device of claim 1, wherein the plurality of transistors are configured to pull down the output node based on a signal on at least one of the data and clock nodes.

3. The device of claim 1, further comprising a driver transistor having a gate node coupled to the output node of the first NOR logic pulse generator, wherein the driver transistor is a sole active device that presents a capacitive load to the output node.

4. The device of claim 3, wherein the driver transistor includes a drain node coupled to drain nodes of other driver transistors that are in turn driven by other NOR logic pulse generators.

5. The device of claim 1, further comprising a plurality of NOR logic pulse generators, wherein the first NOR logic pulse generator is one of the plurality of NOR logic pulse generators.

6. The device of claim 5, wherein each of the plurality of NOR logic pulse generators is driven by different data signals and different combinations of clock signals.

7. The device of claim 5, further comprising a plurality of driver transistors, wherein each of the plurality of driver transistors includes a gate node driven by a corresponding one of the plurality of NOR logic pulse generators.

8. The device of claim 7, wherein the plurality of driver transistors include source nodes coupled in parallel and drain nodes coupled in parallel.

9. The device of claim 1, wherein the pullup structure comprises a single transistor forming a series current path between the output node and the second supply node that includes no more than one active device channel.

10. The device of claim 1, wherein the output node of the first NOR logic pulse generator is directly coupled to a single driver device that generates a weighted output signal according to data signal values received at the gate nodes of the plurality of transistors.

11. The device of claim 1, wherein the active inductor device includes no more than one active device channel forming a current path between the second supply node and the output node.

12. An N-to-1 multiplexer device, comprising:
a plurality of NOR logic pulse generators, wherein each of the plurality of NOR logic pulse generators includes:
a plurality of transistors having drain nodes coupled in parallel to an output node, having source nodes coupled in parallel to a first supply node, and having gate nodes coupled to separate data and clock nodes; and
a pullup structure including at least one transistor coupled to form a current path that includes no more than one active device channel in series between a second supply node and the output node; and
a driver circuit that includes a plurality of driver transistors, wherein each of the driver transistors includes a gate node coupled to the output node of a corresponding one of the plurality of NOR logic pulse generators, and wherein the plurality of driver transistors include drain nodes coupled in parallel to sum output signals from the plurality of NOR logic pulse generators, and wherein the N-to-1 multiplexer device includes differential outputs, and wherein a number of NOR logic pulse generators in the N-to-1 multiplexer device is equal to 2N.

13. The N-to-1 multiplexer device of claim 12, wherein a number of NOR logic pulse generators in the N-to-1 multiplexer device is equal to N.

14. The N-to-1 multiplexer device of claim 12, wherein each of the plurality of NOR logic pulse generators is driven by different data signals and different combinations of clock signals.

15. The N-to-1 multiplexer device of claim 12, wherein N is equal to a power of 2, and wherein a number of clock signals fed to each of the plurality of NOR logic pulse generators is equal to $\log_2 N$.

16. The N-to-1 multiplexer device of claim 12, wherein the pullup structure comprises an active inductor device.

17. The N-to-1 multiplexer device of claim 12, wherein each of the plurality of NOR logic pulse generators is driven by different data signals and different combinations of clock signals.

18. A method, comprising:
providing a plurality of transistors having drain nodes coupled in parallel to an output node, having source nodes coupled in parallel to a first supply node, and having gate nodes coupled to separate data and clock nodes; and
providing a pullup structure including at least one transistor coupled to form a current path that includes no more than one active device channel in series between a second supply node and the output node, wherein the plurality of transistors and the pullup structure form a NOR logic pulse generator that pulls down the output node when any of the plurality of transistors are on and pulls up the output node when all of the plurality of transistors are off, and wherein the pullup structure comprises an active inductor device.

19. The method of claim 18, further comprising:
repeating the providing the plurality of transistors and the providing the pullup structure to form a plurality of NOR logic pulse generators.

20. The method of claim 19, further comprising:
providing a driver circuit that includes a plurality of driver transistors, wherein each of the driver transistors includes a gate node coupled to the output node of a corresponding one of the plurality of NOR logic pulse generators, and wherein the plurality of driver transistors include drain nodes coupled in parallel to sum output signals from the plurality of NOR logic pulse generators.

* * * * *